(12) United States Patent
Stoermer

(10) Patent No.: US 9,620,873 B2
(45) Date of Patent: Apr. 11, 2017

(54) ELECTRICAL CONNECTION ARRANGEMENT

(71) Applicant: Delphi International Operations Luxembourg S.A.R.L., Bascharage (LU)

(72) Inventor: Peter Stoermer, Remscheid (DE)

(73) Assignee: Delphi International Operations Luxembourg SARL, Luxembourg (LU)

( * ) Notice: Subject to any disclaimer, the term of this patent is extended or adjusted under 35 U.S.C. 154(b) by 0 days.

(21) Appl. No.: 14/817,791

(22) Filed: Aug. 4, 2015

(65) Prior Publication Data
US 2016/0043485 A1 Feb. 11, 2016

(30) Foreign Application Priority Data
Aug. 5, 2014 (EP) .................... 14179926

(51) Int. Cl.
| | |
|---|---|
| *H05K 7/20* | (2006.01) |
| *H01R 12/70* | (2011.01) |
| *H01R 12/71* | (2011.01) |
| *H01R 12/75* | (2011.01) |
| *H05K 1/02* | (2006.01) |
| *H05K 1/11* | (2006.01) |
| *H01R 12/88* | (2011.01) |

(52) U.S. Cl.
CPC ....... *H01R 12/7076* (2013.01); *H01R 12/714* (2013.01); *H01R 12/75* (2013.01); *H05K 1/0209* (2013.01); *H05K 1/0263* (2013.01); *H05K 1/117* (2013.01); *H01R 12/7088* (2013.01); *H01R 12/88* (2013.01); *H05K 1/0204* (2013.01); *H05K 2201/066* (2013.01); *H05K 2201/10356* (2013.01); *H05K 2201/10393* (2013.01); *H05K 2201/10598* (2013.01); *H05K 2201/10969* (2013.01)

(58) Field of Classification Search
CPC .... H05K 7/205; H05K 1/0201; H05K 1/0203; H05K 1/0209; H01L 23/14
USPC ............... 361/718, 719, 720, 760, 764, 783
See application file for complete search history.

(56) References Cited

U.S. PATENT DOCUMENTS

| | | | | |
|---|---|---|---|---|
| 4,420,206 | A |   | 12/1983 | Martyniak |
| 4,645,943 | A | * | 2/1987 | Smith, Jr. ................. G06F 1/30 307/150 |
| 4,935,864 | A | * | 6/1990 | Schmidt .................. H01L 23/38 257/467 |
| 5,469,330 | A | * | 11/1995 | Karabatsos ............ H01R 9/091 165/185 |
| 5,470,795 | A | * | 11/1995 | Shushurin .............. H05K 3/301 29/837 |

(Continued)

FOREIGN PATENT DOCUMENTS

| | | |
|---|---|---|
| DE | 10 2008 040290 A1 | 1/2010 |
| EP | 2 259 312 A1 | 12/2010 |
| EP | 2 362 719 A1 | 8/2011 |

*Primary Examiner* — Thanh Tam Le
(74) *Attorney, Agent, or Firm* — Lawrence D Hazelton

(57) ABSTRACT

A connection arrangement includes a printed circuit board, a semiconductor component arranged on a first surface, a first side, of the printed circuit board, a connection means arranged on a second surface, a second side, of the printed circuit board, a contact element contactable with the connection means and an electrical line, wherein the connection means is arranged opposite the semiconductor component.

13 Claims, 4 Drawing Sheets

(56) References Cited

U.S. PATENT DOCUMENTS

| | | | |
|---|---|---|---|
| 5,953,214 A | 9/1999 | Dranchak et al. | |
| 6,018,465 A * | 1/2000 | Borkar | G06F 1/183 |
| | | | 257/E23.084 |
| 6,061,241 A * | 5/2000 | Handforth | H04M 3/005 |
| | | | 174/250 |
| 6,441,520 B1 * | 8/2002 | Grant | H01L 25/16 |
| | | | 174/252 |
| 7,233,502 B1 * | 6/2007 | Chang | H05K 1/144 |
| | | | 361/600 |
| 7,394,665 B2 * | 7/2008 | Hamasaki | G02B 6/43 |
| | | | 361/706 |
| 7,510,418 B1 | 3/2009 | Scott et al. | |
| 8,068,346 B2 * | 11/2011 | Maier | H01L 25/16 |
| | | | 174/252 |
| 8,094,455 B2 * | 1/2012 | Hong-Chi | H01R 12/716 |
| | | | 174/16.1 |
| 8,657,031 B2 * | 2/2014 | Kononenko | B25F 5/00 |
| | | | 173/176 |
| 8,724,339 B2 * | 5/2014 | Prest | G06F 1/1626 |
| | | | 361/760 |
| 2012/0081859 A1 | 4/2012 | Christo et al. | |
| 2012/0149249 A1 | 6/2012 | Ihara | |

\* cited by examiner

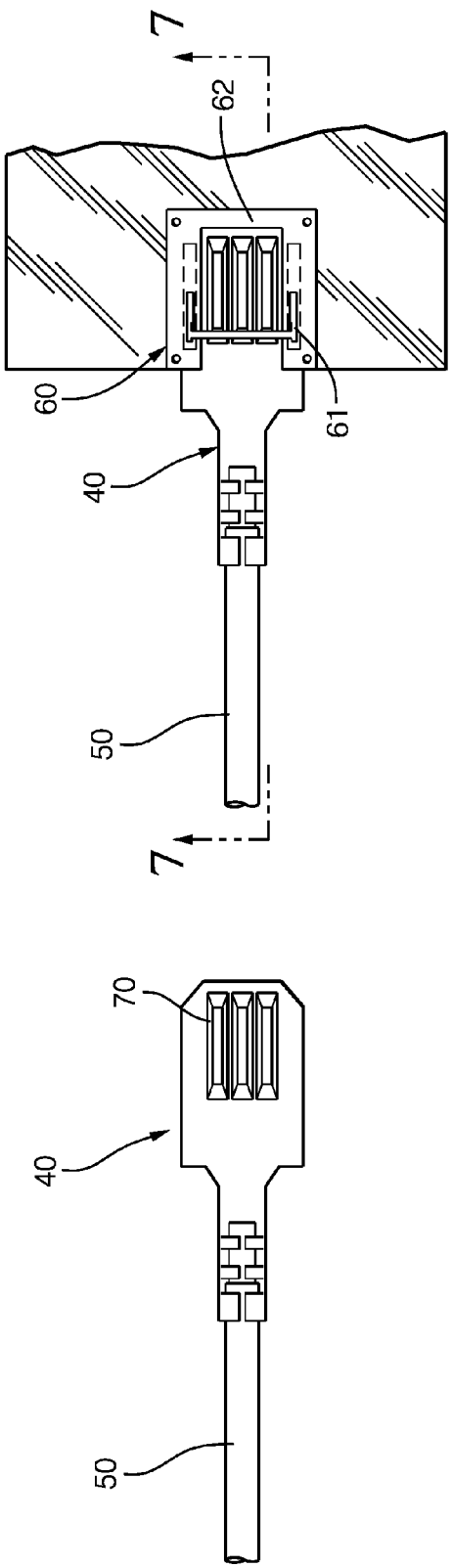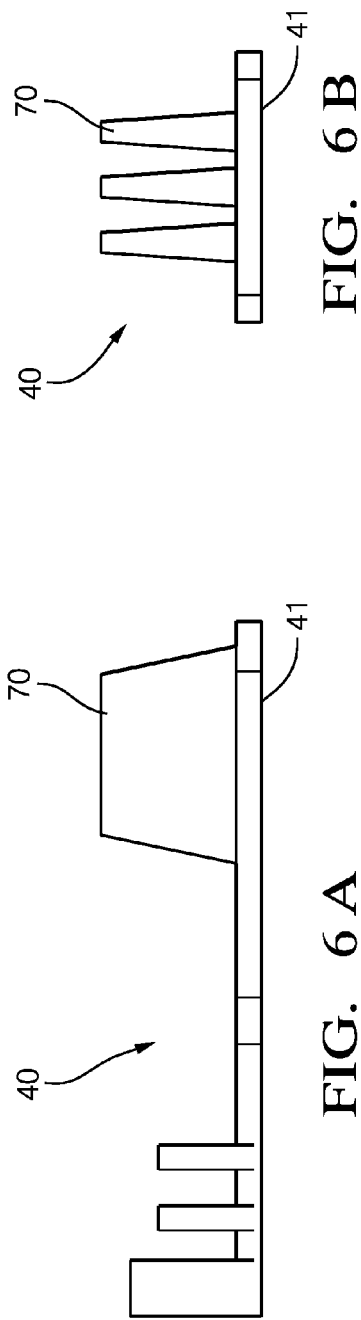

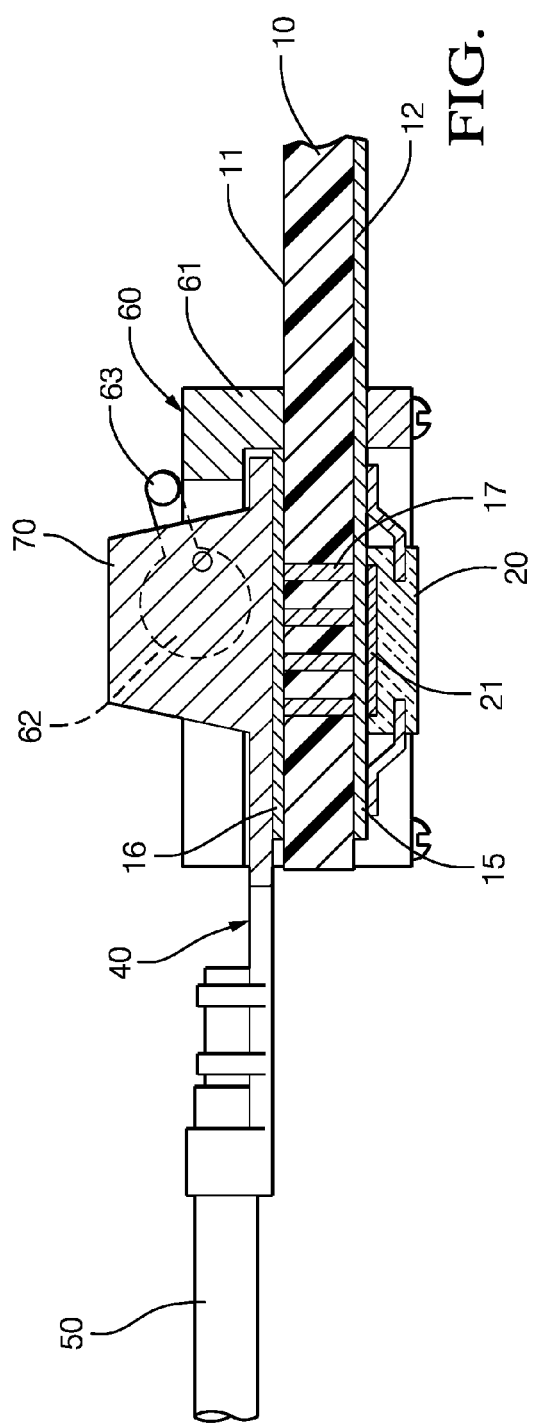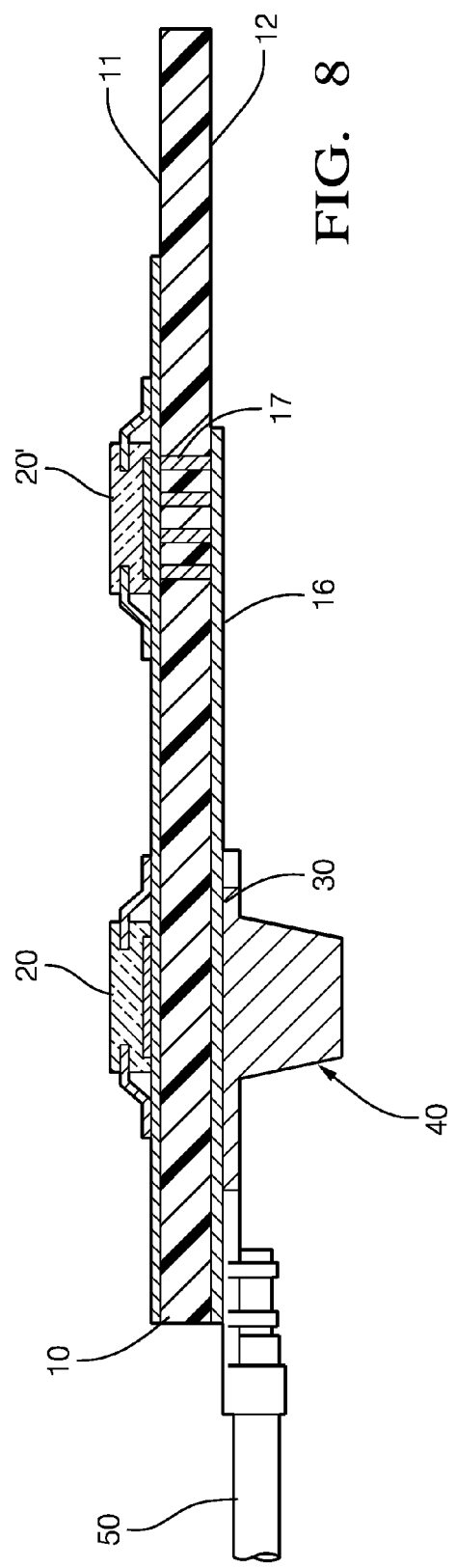

ELECTRICAL CONNECTION ARRANGEMENT

CROSS-REFERENCE TO RELATED APPLICATION

This application claims the benefit under 35 U.S.C. §119 (a) of European Patent Application EP 14179926.2, filed Aug. 5, 2014, the entire disclosure of which is hereby incorporated herein by reference.

TECHNICAL FIELD OF INVENTION

This disclosure generally relates to an electrical connection arrangement for electrically connecting a cable and a printed circuit board.

BACKGROUND OF INVENTION

In modern motor vehicles, in particular electric vehicles, large electrical currents are necessary for the operation of the vehicles. These large currents are transported in the cable harness of the vehicle through appropriately dimensioned lines or conductors or cables between the battery and the electrical load, e.g. an electric motor. Lines or conductors or cables with large cross sections are used to keep the electric losses low caused by the resistance of the lines. The use of lightweight aluminum lines additionally increases the cross sections of the lines. The currents are controlled by semiconductor components located in control units (ECU). The term control unit is used in automotive engineering generally as collective term for electrical units distributed in housings. The semiconductor components are usually arranged on printed circuit boards, on which there are also other electronic components. To connect the printed circuit boards and the components arranged thereon with the on-board system, usually contact elements are provided on the printed circuit board. These can be connected to mating contacts, which are arranged at the ends of the cables of the cable harness. Within vehicles the installation space is naturally tight. Therefore, the contacts in general are attached to the edges of the printed circuit board to allow for a flat design of the control unit. This situation requires that the plug contacts need to be designed such that they are accessible on the housing wall for the contact parts of the cable harness. The contact elements have a cover of plastic material for protection. This socket at the control unit is generally referred to as "header". The contact parts of the cable ends of the cable harness are integrated in a connector housing. This type of electrically contacting of cable harness and control unit has been proven in automotive engineering for many years. However, there are limits if the currents to be transmitted are getting into orders of magnitude of Amperes, as occur with electric vehicles by default. The transfer resistance of these contact systems is significant; they consume electrical energy that they convert into heat. Contact elements for large current densities have large dimensions with relatively low resistance, since the resistance of the current path need not get too large. Large contact elements require large plugs and corresponding sockets. This increases the required space for the control units. Another problem is in the control units themselves. A not to be underestimated thermal load is formed by the large currents flowing through the electrical components. This heat needs to be dissipated through thermally good conductive elements, which are mounted to the heat-generating elements, to the housing and to the environment. In addition, passive and/or active ventilation systems may need to be provided for guiding air into the housing for cooling and discharging the heated air. This need for cooling makes the control units bigger, heavier, and more expensive.

SUMMARY OF THE INVENTION

The invention is based on the object of providing a connection system that, with low electrical resistance, electrically connects the lines of a cable harness with the printed circuit board and the electrical components of a control unit provided thereon. In addition, the connection system should assist the cooling of the control unit.

In accordance with one embodiment, a connection arrangement is provided. The connection arrangement includes a printed circuit board, a semiconductor component arranged on a first surface, a first side, of the printed circuit board, a connection means arranged on a second surface, a second side, of the printed circuit board, a contact element contactable with the connection means and an electric line wherein the connection means is arranged opposite the semiconductor component.

Printed circuit boards used in the art have a structure in which a substrate is provided with an electrically conductive coating. One side or both sides may be electrically coated. Usually, areas are removed from the substrate which should not be conductive. The position of the connection means, which here is made from a portion of the conductive coating, is chosen on the printed circuit board such that it is positioned opposite a semiconductor component. The term "opposite" should have the meaning as follows. The connection means is arranged on the printed circuit board such that if the substrate would be removed from the printed circuit board, the semiconductor component would rest on the connection means. In other words, a virtual axis passing through the center of the semiconductor component and vertically through the printed circuit board also passes through the connection means.

This has the effect that the heat generated from the semiconductor component is passed through the printed circuit board to the connection means. From there, the heat can be dissipated via the contact element directly to the environment and also passed into the electric line. Thereby, a portion of the unwanted heat may be transported from the control unit to the cable harness, from where it is released into the environment.

Preferably, the connection means is formed from a portion of the conductive coating of the printed circuit board. Thus, the connection means is already firmly connected to the printed circuit board after the manufacturing process of the printed circuit board. The geometry of the connection means can be easily adapted to required current density and contact element geometry. When attaching an adapted contact element to the printed circuit board, a large area of the contact element is electrically connected to a large area of the conductive coating of the printed circuit board. By the extensive connection of the two electrically conductive surfaces, a low transfer resistance is achieved. Little heat is produced at this low transfer resistance, even with larger current densities.

More preferably, the semiconductor component and the opposite connection means are arranged spaced apart from the edge of the printed circuit board. The connection arrangement enables optimum freedom of design for the layout of the printed circuit board, since the plug connections no longer need to be on the sides of the printed circuit board.

Preferably, a second semiconductor component is arranged on the first surface, the first side, of the printed circuit board and electrically connectable to the contact element. In this way, the first semiconductor component may be cooled by the contact element, which is opposite the first semiconductor component. Whereas the second semiconductor component, which is not positioned opposite, is powered without being cooled. Thus, the thermal design of the control unit is simplified. Electrical and thermal issues can be considered separately.

More preferably, the semiconductor component is electrically connected at least with a portion of the conductive coating, which extends between the semiconductor component and substrate of the printed circuit board. Thus, the thermal and electrical behavior of the circuit may be easier planned. The first conductive coating is also used for heat conduction. The semiconductor component can dissipate heat quickly to the conductive coating. From there, the heat diffuses through the substrate to the connection means. To increase the cooling effect, the first conductive coating may be chosen greater than the dimensions of the semiconductor component. The heat transport through the substrate is the better the larger the areas are.

Preferably, the area of the connection means is larger than the area of the conductive coating of the printed circuit board, which is arranged between the semiconductor component and substrate. Thereby, the area with a higher thermal conductivity is increased in the vicinity of the semiconductor component, whereby the area is cooled more efficiently.

Preferably, the printed circuit board comprises at least one via in the area between the semiconductor component and the contact element. This reduces the electrical and thermal resistance between the conductive coatings of the printed circuit board. The via is usually performed by attaching a rivet in a bore of the substrate of the printed circuit board. The bore usually extends perpendicular to the surfaces. Hence, the shortest path for current and heat results.

More preferably, the contact element has a flat surface, which is adapted to generate an electrical connection with the connection means. When attaching the contact element to the printed circuit board, a large area of the contact element is electrically connected to a large area of the conductive coating of the printed circuit board. With the extensive connection of the two electrically conductive surfaces, a low transfer resistance is achieved. Little heat is produced at this low transfer resistance, even with larger current densities.

Preferably, the contact element comprises means for cooling. The contact element may be cooled by means of fluids. It may comprise cooling fins or be of solid construction. In solid constructions, bores or channels may be provided through which a coolant can flow. Also, thermally conductive elements may protrude from the contact element, which are connected to the housing of the control unit or other elements used for cooling. A cooled contact element can additionally increase the cooling capacity for a semiconductor component.

Preferably, the connection arrangement comprises holding means that releasably hold together the contact element and the connection means. As holding means all mechanical devices can be used which are able to hold together the contact element and the connection means. Provided, that a good electrical and thermal connection is guaranteed.

More preferably, the holding means is adapted such that when actuating the holding means, the contact element is pressed against the connection means and part of the holding means is pressed against the semiconductor component. This ensures that the contact surfaces lie close together and have a low resistance. Further, the holding means additionally cools the semiconductor component.

Preferably, the holding means has a U-shaped cross section and an eccentric is attached to one of the legs. The eccentric is pivotable into the space between the legs. The eccentric pivots into the space between the legs and pushes material, which is inbetween, towards the opposite leg. If the printed circuit board and the contact element are located between the legs, the eccentric pushes these elements against the second leg. A lever is mounted at the eccentric, with which the eccentric can be pivoted. Said arrangement is easy to operate and works reliably.

Preferably, the holding means comprises means for cooling. The holding means may be cooled by means of fluids. It may have cooling fins or be solid. In a solid embodiment, bores or channels may be provided through which a coolant may flow. Thermally conductive elements may protrude from the holding means, which are connected to the housing of the control unit or other elements used for cooling.

Preferably, the connection arrangement is suitable for high current applications.

More preferably, the electrical line comprises a braid with a plurality of wires and an insulating layer encircling the braid. In high current applications in vehicles, large conductor cross sections are required. To mount these lines in the vehicle, they need to be flexible. By using very thin individual wires in the braid and elastic material in the insulation, highly flexible lines can be produced. Contact elements may be attached at the line ends using established techniques such as crimping or welding.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 4 shows a contact element to which an electrical line is attached;

FIG. 5 shows a contact element attached to the second side of the printed circuit board;

FIG. 6A shows a side view of the contact element;

FIG. 6B shows another side view of the contact element;

FIG. 7 shows a sectional view of FIG. 5; and

FIG. 8 shows a sectional view of a printed circuit board with attached contact element and two semiconductor components.

DETAILED DESCRIPTION

In the following, preferred embodiments of the invention will be described in more detail. Similar or corresponding details of the inventive subject are provided with the same reference numbers.

Figure 1:
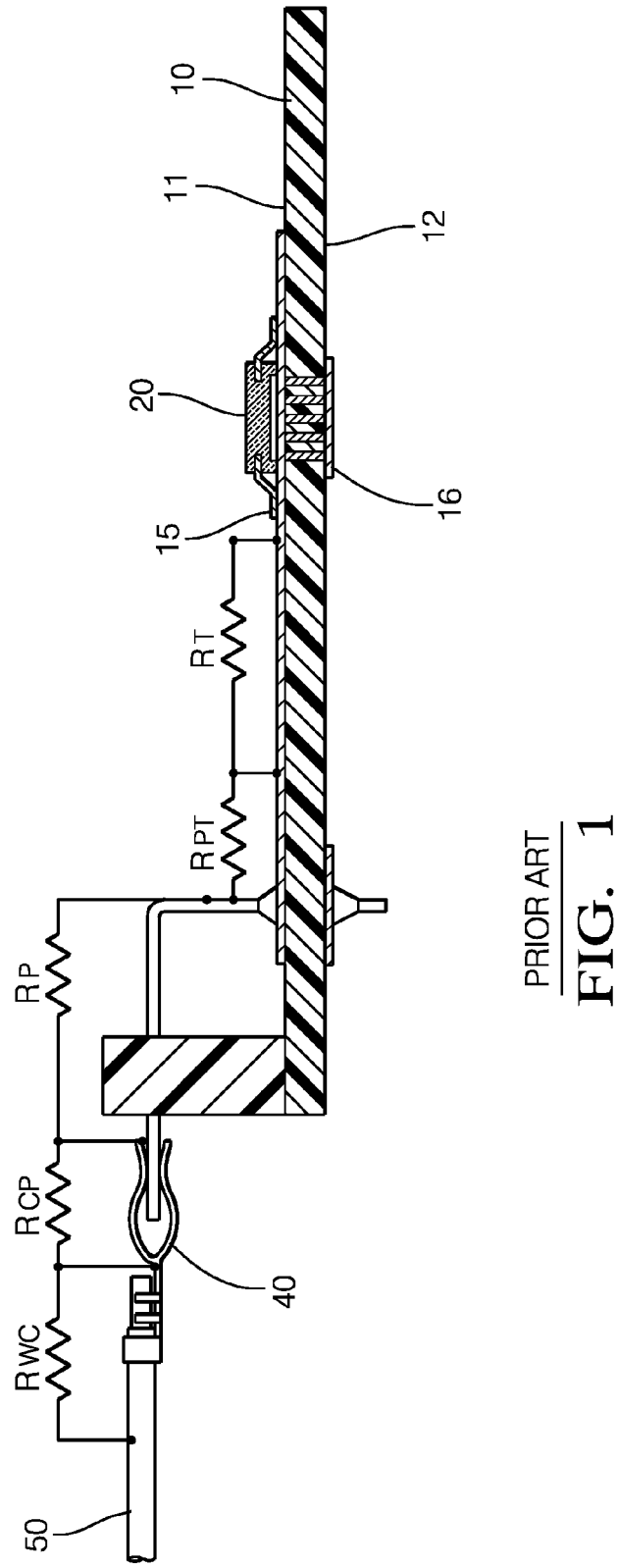
FIG. 1 shows a connection arrangement of the prior art.

FIG. 1 shows a connection arrangement of the prior art in a sectional view. A semiconductor component 20 is disposed on a printed circuit board 10; the printed circuit board 10 is electrically connected via a contact element 40 with an electrical line 50. The printed circuit board 10 comprises on the first surface 13, a first side 11, a first conductive coating 15, and on a second surface 14, a second side 12, and a second conductive coating 16. The semiconductor component 20 is powered via the electric line 50, the contact element 40, and the conductive coatings 15, 16. The electrical resistances which oppose the current flow are denoted by reference numeral Rwc, Rcp, Rp, Rpt, and Rt. In this Fig. it may easily be seen that the electric current has to overcome a plurality of partial resistances to reach the semiconductor component.

Figure 2:
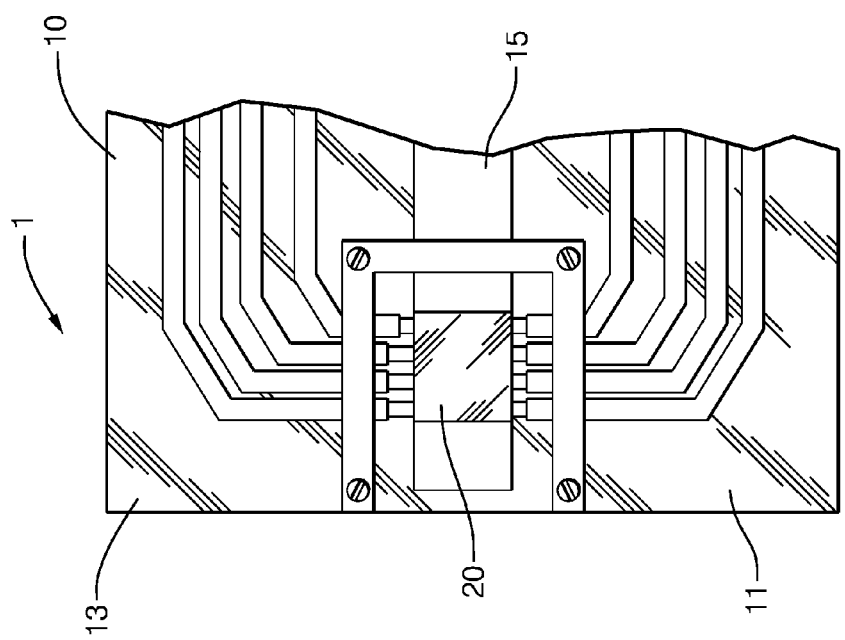
FIG. 2 shows a view of the first side of the printed circuit board.

FIG. 2 shows the first side 11 of the inventive connection arrangement. A semiconductor component 20 is mounted on the first surface 13 and electrically connected with parts of the first conductive coating 15.

Figure 3:
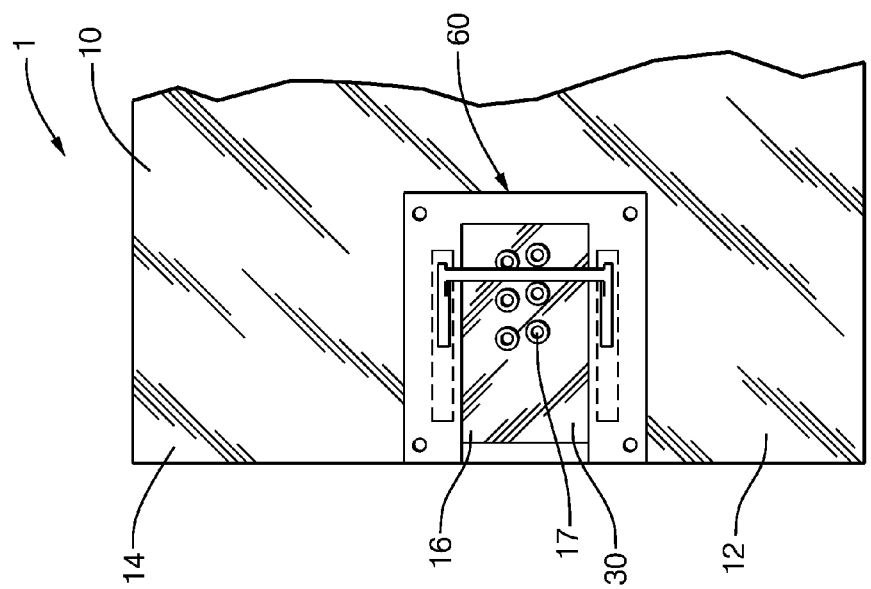
FIG. 3 shows a view of the second side of the printed circuit board.

FIG. 3 shows the second side 12 of the inventive connection arrangement. The second conductive coating 16 is shown on the second surface 14. A connection means 30 is generated from a portion of the second conductive coating 16. This is already done with the manufacturing of the printed circuit board 10. The connection means 30 is generated when etching or milling the conductor traces. The shape of the connection means 30 corresponds to the shape of a contact portion 41 of the contact element 40. The shape and size of the contact area 41 should be chosen such that the surfaces do not substantially overlap, when the contact portion 41 is contacted with the connection means 30. Only where contact area 41 and connection means 30 are connected to each other, current and heat is optimally transported.

Vias 17 are shown in the area of the connection means 30, providing an electrical connection between the first electrically conductive coating 15 and the second electrically conductive coating 16. The vias 17 are not visible in FIG. 2, since they are obstructed by the semiconductor component 20. A holding means 60, which will be explained in more detail, is also shown in FIG. 3.

FIG. 4 shows the contact element 40 in a top view. The electric line 50 is connected with the contact element 40 by means of a crimp connection.

FIG. 5 shows the contact element 40 with the attached electrical line 50. The holding means 60 comprises a clamping profile 61 and an eccentric 62 to which a lever 63 is attached. The mode of operation of the holding means 60 can be derived from FIG. 7.

FIGS. 6A and 6B show the contact element 40 in lateral views. The planar contact area 41 can be seen, with which the contact element 40 contacts the connection means 30. The contact element 40 in this embodiment comprises coolants 70 in the form of cooling ribs extending from the contact area 41, opposite the contact area 41. In the connection area of the contact element 40, which is provided for connection with a wiring harness, the electrical line 50 is mounted by means of a crimp connection. However, any known connection technologies, such as screw connections, solder or weld joints, could be used.

FIG. 7 shows an embodiment of the invention in sectional view. The contact element 40, with the attached electrical line 50, is pressed with the holding means 60 to the second conductive coating 16 of the printed circuit board 10 and thus electrically contacted through the connection means 30. The contact element 40 and the connection means 30 are located on the second side 12 of the printed circuit board 10, opposite the semiconductor component 20, which is mounted on the first side 11. The connection means 30 comprises vias 17 extending through the printed circuit board 10 from the first conductive coating 15 to the second conductive coating 16 and connecting them together. The semiconductor component 20 comprises a contact area 21 at the side of its body facing the printed circuit board. The contact area 21 is electrically connected to the first conductive coating 15. This arrangement enables realization of a current path, starting from the electrical line 50 to the semiconductor component 20 with low resistance. Moreover, this arrangement offers the possibility to use the contact element 40 and the electrical line 50 as cooling elements, since they are located directly adjacent to the heat source (semiconductor component), separated only by the printed circuit board. By this proximity, the arrangement is able to cool effectively.

FIG. 8 shows an embodiment in which two semiconductor components 20, 20' are arranged on the first side 11, of the printed circuit board 10. The contact element 40 is mounted at a position opposite the first semiconductor component 20. However, the semiconductor component 20 is not provided for controlling the current transported via the electrical line 50. The contact element 40 is electrically connected to the second semiconductor component 20' through the second conductive coating 16. The second semiconductor component 20' controls the current flowing through the electrical line 50. In this embodiment, a semiconductor component 20 is cooled by selecting the position opposite the connection means 30 and thus the contact element 40, but not supplied with power. The second semiconductor component 20' is supplied with power but not cooled by the contact element 40, since it is not opposite the contact element 40. Here, smaller balancing heat flows in the conductive coatings 15, 16 are not considered.

While this invention has been described in terms of the preferred embodiments thereof, it is not intended to be so limited, but rather only to the extent set forth in the claims that follow.

I claim:

1. A connection arrangement comprising:
    a printed circuit board;
    a semiconductor component arranged on a first surface of a first side of the printed circuit board;
    a connection means arranged on a second surface of a second side of the printed circuit board opposite the first surface and the first side;
    a contact element contactable with the connection means and an electrical line, wherein the connection means is arranged opposite the semiconductor component; and
    a holding means operable to releasably press together the contact element and the connection means;
    wherein the holding means is adapted such that upon an actuation of the holding means, the contact element is pressed against the connection means and a part of the holding means is pressed against the semiconductor component; and
    wherein the holding means has a U-shaped cross section that defines two legs are parallel to each other, and an eccentric is attached to one of the two legs such that the eccentric is pivotable into a space between the two legs.

2. The connection arrangement according to claim 1, wherein the connection means is formed from a portion of a second conductive coating of the printed circuit board.

3. The connection arrangement according to claim 1, wherein the semiconductor component and the connection means are arranged spaced apart from an edge of the printed circuit board.

4. The connection arrangement according to claim 1, wherein a second semiconductor component is arranged on the first surface of the first side of the printed circuit board and is directly electrically connected to the contact element.

5. The connection arrangement according to claim 1, wherein the semiconductor component is electrically connected at least with a portion of a conductive coating extending between the semiconductor component and a substrate of the printed circuit board.

6. The connection arrangement according to claim 1, wherein the connection means is formed from a portion of a second conductive coating of the printed circuit board, and an area of the connection means is larger than an area of the conductive coating of the printed circuit board, which is arranged between the semiconductor component and substrate.

7. The connection arrangement according to claim 1, wherein the printed circuit board comprises at least one via in the area between the semiconductor component and the connection means.

8. The connection arrangement according to claim 1, wherein the contact element has a planar surface which is adapted to provide an electrical connection to the connection means.

9. The connection arrangement according to claim 1, wherein the contact element comprises means for cooling.

10. The connection arrangement according to claim 1, wherein the holding means comprises means for cooling.

11. The connection arrangement according to claim 1, wherein the connection arrangement is suitable for high current applications.

12. The connection arrangement according to claim 1, wherein the electrical line comprises an insulating layer.

13. The connection arrangement according to claim 12, wherein the electrical line comprises a braid with a plurality of wires and the insulating layer encircles the braid.

* * * * *